(12) United States Patent
Sakamoto et al.

(10) Patent No.: US 8,617,964 B2
(45) Date of Patent: Dec. 31, 2013

(54) LASER PROCESSING METHOD

(75) Inventors: Takeshi Sakamoto, Shizuoka (JP);
Kenichi Muramatsu, Shizuoka (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/308,814

(22) Filed: Dec. 1, 2011

(65) Prior Publication Data
US 2012/0067857 A1 Mar. 22, 2012

Related U.S. Application Data

(63) Continuation of application No. 12/063,560, filed as application No. PCT/JP2006/315527 on Aug. 4, 2006, now Pat. No. 8,247,311.

(30) Foreign Application Priority Data

Aug. 12, 2005 (JP) ................. P2005-235037

(51) Int. Cl.
*H01L 21/00* (2006.01)

(52) U.S. Cl.
USPC ........... 438/463; 438/460; 438/458; 438/113; 438/114; 257/678; 257/E21.596

(58) Field of Classification Search
USPC .................... 438/463, 460, 458, 113, 114; 257/E21.499–E21.501, 678, E21.596
See application file for complete search history.

(56) References Cited

U.S. PATENT DOCUMENTS

| 6,420,678 B1 | 7/2002 | Hoekstra |
| 6,760,973 B1 | 7/2004 | Koide |
| 2004/0002199 A1 | 1/2004 | Fukuyo et al. |

(Continued)

FOREIGN PATENT DOCUMENTS

| JP | 10-314965 | 12/1998 |
| JP | 2000-71088 | 3/2000 |

(Continued)

OTHER PUBLICATIONS

K. Hayashi; "Inner Glass Marking by Harmonics of Solid-State Laser", Proceedings of 45$^{th}$ Laser Materials Processing Conference, Dec. 1998, pp. 23-28.

(Continued)

*Primary Examiner* — Kimberly Rizkallah
*Assistant Examiner* — Maria Ligai
(74) *Attorney, Agent, or Firm* — Drinker Biddle & Reath LLP

(57) ABSTRACT

A laser processing method for preventing particles from occurring from cut sections of chips obtained by cutting a silicon wafer is provided. An irradiation condition of laser light L for forming modified regions $7_7$ to $7_{12}$ is made different from an irradiation condition of laser light L for forming the modified regions $7_{13}$ to $7_{19}$ such as to correct the spherical aberration of laser light L in areas where the depth from the front face 3 of a silicon wafer 11 is 335 μm to 525 μm. Therefore, even when the silicon wafer 11 and a functional device layer 16 are cut into semiconductor chips from modified regions $7_1$ to $7_{19}$ acting as a cutting start point, twist hackles do not appear remarkably in the areas where the depth is 335 μm to 525 μm, whereby particles are hard to occur.

10 Claims, 21 Drawing Sheets

(56) References Cited

U.S. PATENT DOCUMENTS

| | | |
|---|---|---|
| 2005/0006361 A1 | 1/2005 | Kobayashi et al. |
| 2005/0109743 A1 | 5/2005 | Tanabe et al. |
| 2005/0199592 A1* | 9/2005 | Iri et al. .................. 219/121.6 |
| 2006/0261050 A1 | 11/2006 | Krishnan et al. |

FOREIGN PATENT DOCUMENTS

| | | |
|---|---|---|
| JP | 2002-205180 | 7/2002 |
| JP | 2004-77914 | 3/2004 |
| JP | 2005-19667 | 1/2005 |
| TW | 200515966 | 5/2005 |
| TW | I250060 B | 3/2006 |
| WO | WO 01/15819 | 3/2001 |
| WO | 2005/106564 | 11/2005 |

OTHER PUBLICATIONS

K. Miura et al., "Formation of Photo-Induced Structures in Glasses with Femtosecond Laser", Proceedings of $42^{nd}$ Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

* cited by examiner (a)

(b)

(a)

(b)

(a)

(b)

(a)

(b)

LASER PROCESSING METHOD

This is a continuation application of copending prior application Ser. No. 12/063,560, filed on May 13, 2008, which is incorporated by reference herein in its entirety, and which is National Stage of International Application No. PCT/JP2006/315527 filed Aug. 4, 2006.

TECHNICAL FIELD

The present invention relates to a laser processing method which forms a plurality of rows of modified regions to become a cutting start point within a silicon wafer along a line to cut the silicon wafer.

BACKGROUND ART

Conventionally known as this kind of technique is a method of irradiating a semiconductor substrate with laser light so as to form a plurality of rows of modified parts within the semiconductor substrate along a street of the semiconductor substrate, and cutting the semiconductor substrate along the street (see, for example, Patent Document 1).

Patent Document 1: Japanese Patent Application Laid-Open No. 2005-19667

DISCLOSURE OF THE INVENTION

Problem to be Solved by the Invention

When cutting the semiconductor substrate by the above-mentioned method, however, particles may occur from thus cut section and contaminate semiconductor chips obtained by the cutting.

In view of such circumstances, it is an object of the present invention to provide a laser processing method for preventing particles from occurring from cut sections of chips obtained by cutting a silicon wafer.

Means for Solving Problem

The inventors conducted diligent studies in order to achieve the above-mentioned object and, as a result, have found out that particles occur from cut sections of chips obtained by cutting a silicon wafer because of twist hackles appearing in modified regions formed in predetermined areas of the silicon wafer.

Namely, when laser light is converged within a silicon wafer having a thickness t (500 μm<t) by a condenser lens, so as to form and cut a plurality of rows of modified regions within the silicon wafer along a line to cut the silicon wafer, twist hackles remarkably appear on the cut sections in at least areas of the silicon wafer where the depth from the laser light entrance surface is 350 μm to 500 μm. Therefore, minute parts between the twist hackles peel off, thereby generating silicon particles.

FIG. 18 is a view showing a photograph of a cut section of a silicon wafer when forming 19 rows of modified regions for a line to cut in the silicon wafer having a thickness of 625 μm by a conventional laser processing method. Modified regions $7_1$ to $7_{19}$ were successively formed from the rear face 21 side under the conditions listed in the following Table 1, while using the front face 3 of the silicon wafer 11 as the laser light entrance surface. In the following Table 1, the converging point position refers to the distance from the front face 3 to the position at which the laser light converging point is focused (ditto in the following). The exit output is the output of the laser light emitted from the condenser lens, while the divergent angle is the divergent angle of laser light incident on the condenser lens (ditto in the following).

TABLE 1

|  | Converging point position (μm) | Exit output (W) | Divergent angle (°) |
| --- | --- | --- | --- |
| Modified region $7_1$ | 618 | 1.2 | 0.2 |
| Modified region $7_2$ | 599 | 1.2 | 0.2 |
| Modified region $7_3$ | 580 | 1.2 | 0.2 |
| Modified region $7_4$ | 561 | 1.2 | 0.2 |
| Modified region $7_5$ | 535 | 1.2 | 0.2 |
| Modified region $7_6$ | 517 | 1.2 | 0.2 |
| Modified region $7_7$ | 494 | 1.2 | 0.2 |
| Modified region $7_8$ | 467 | 1.2 | 0.2 |
| Modified region $7_9$ | 440 | 1.2 | 0.2 |
| Modified region $7_{10}$ | 409 | 1.2 | 0.2 |
| Modified region $7_{11}$ | 375 | 1.2 | 0.2 |
| Modified region $7_{12}$ | 342 | 1.2 | 0.2 |
| Modified region $7_{13}$ | 305 | 1.2 | 0.2 |
| Modified region $7_{14}$ | 280 | 1.2 | 0.2 |
| Modified region $7_{15}$ | 245 | 1.2 | 0.2 |
| Modified region $7_{16}$ | 210 | 1.2 | 0.2 |
| Modified region $7_{17}$ | 174 | 1.2 | 0.2 |
| Modified region $7_{18}$ | 121 | 1.2 | 0.2 |
| Modified region $7_{19}$ | 69 | 0.72 | 0.2 |

In this example, as shown in FIG. 18, twist hackles (dark parts) 51 remarkably appeared in areas of the silicon wafer 11 where the depth from the front face 3 was 310 μm to 540 μm. It seems that, when the twist hackles 51 appear remarkably, minute parts 52 between the twist hackles 51 are likely to peel off, whereby particles are easy to occur in the areas where the depth from the front face 3 was 310 μm to 540 μm. In areas of the silicon wafer 11 where the depth from the front face 3 exceeds 540 μm, the twist hackles 51 appear only unremarkably as shown in FIG. 20, so that particles seem to be hard to occur.

Then, the inventors have found that twist hackles remarkably appear on cut sections in at least areas of a silicon wafer where the depth from the laser light entrance surface is 350 μm to 500 μm because of an increase in spherical aberration of laser light in the areas having the depth of 350 μm to 500 μm.

When incident on the silicon wafer 11, laser light L advances while being refracted according to Snell's law as shown in FIG. 21. Therefore, as a condenser lens 53 is brought closer to the silicon wafer 11 in order to converge the laser light into an area of the wafer 11 deeper from the front face 3, the converging position P1 of center rays L1 and the converging position P2 of marginal rays L2 deviate more from each other in the thickness direction of the wafer 11. Consequently, the converging point of laser light L widens in the thickness direction of the wafer 11, so that the degree of convergence of laser light L worsens, thereby forming a low-quality, uneven modified region extending in the thickness direction of the wafer 11 (a modified region which is severed into a plurality of parts without connecting together in the thickness direction of the wafer 11 notwithstanding one shot of the laser light L). As a result, it seems that low-quality modified regions unnaturally try to connect each other when severed, so as to generate twist hackles, while uneven fractures occur because of uneven modified regions, whereby particles peeling from cut sections of the wafer 11 are likely to occur between the fractures and twist hackles. The twist hackles 51 do not appear remarkably in areas of the silicon wafer 11 where the depth from the front face 3 exceeds 540 μm in the above-mentioned example because of the following reason. Namely, it seems that the energy density of laser light L at the converging point P becomes smaller in the areas having the depth exceeding 540 µm, so that the width of the modified region formed in the thickness direction of the wafer 11 becomes smaller (which seems to be because a part of the laser light L having a lower degree of convergence yields such a small energy that it fails to exceed a processing threshold), uneven modified regions decrease, while reducing uneven fractures at the time of severing, whereby twist hackles can be restrained from occurring, and particles generated between the twist hackles and fractures decrease.

The inventors conducted further studies based on the foregoing findings and have completed the present invention.

In one aspect, the laser processing method in accordance with the present invention is a laser processing method of converging laser light within a silicon wafer having a thickness t (500 µm<t) with a condenser lens so as to form a plurality of rows of modified regions to become a cutting start point within the silicon wafer along a line to cut the silicon wafer, the method comprising the steps of forming a first modified region along the line to cut in a first area having a depth of 350 µm to 500 µm from a laser light entrance surface of the silicon wafer, and forming a second modified region along the line to cut in a second area having a depth of 0 µm to 250 µm from the laser light entrance surface; wherein a laser light irradiation condition for forming the first modified region is made different from a laser light irradiation condition for forming the second modified region such as to correct a spherical aberration of the laser light in the first area.

In another aspect, the laser processing method in accordance with the present invention is a laser processing method of converging laser light within a silicon wafer having a thickness t (350 µm<t≤500 µm) with a condenser lens so as to form a plurality of rows of modified regions to become a cutting start point within the silicon wafer along a line to cut the silicon wafer, the method comprising the steps of forming a first modified region along the line to cut in a first area having a depth of 350 µm to t µm from a laser light entrance surface of the silicon wafer, and forming a second modified region along the line to cut in a second area having a depth of 0 µm to 250 µm from the laser light entrance surface; wherein a laser light irradiation condition for forming the first modified region is made different from a laser light irradiation condition for forming the second modified region such as to correct a spherical aberration of the laser light in the first area.

In these laser processing methods, laser light irradiation conditions are changed such that the spherical aberration of laser light is corrected when forming the first modified region in the first area having a depth of 350 µm to 500 µm from the laser light entrance surface of the silicon wafer for the silicon wafer having a thickness t (500 µm<t) and when forming the first modified region in the first area having a depth of 350 µm to t µm from the laser light entrance surface of the silicon wafer for the silicon wafer having a thickness t (350 µm<t≤500 µm). Therefore, when cutting the silicon wafer into chips from the first and second modified regions acting as a cutting start point, twist hackles do not appear remarkably in the first area, whereby particles are hard to occur. Hence, these laser cutting methods can prevent particles from occurring from cut sections of chips during and after cutting. The step of forming the first modified region in the first area and the step of forming the second modified region in the second area can be performed in any order.

In the laser processing methods in accordance with the present invention, the first and second modified regions are formed by generating multiphoton absorption or other optical absorptions within the silicon wafer by converging the laser light within the silicon wafer with the condenser lens. An example of the first and second modified regions formed within the silicon wafer is a molten processed region.

Preferably, in the laser processing methods in accordance with the present invention, the laser light incident on the condenser lens when forming the first modified region has a divergent angle greater than that of the laser light incident on the condenser lens when forming the second modified region. Preferably, the condenser lens when forming the first modified region has an exit NA greater than that of the condenser lens when forming the second modified region. Preferably, a spherical aberration correction member is arranged between the condenser lens and silicon wafer when forming the first modified region. These can make the laser irradiation condition for forming the first modified region different from the laser irradiation condition for forming the second modified region such as to correct the spherical aberration of laser light in the first region.

Effect of the Invention

Even when a silicon wafer is cut into chips, the present invention can prevent particles from occurring from cut sections of the chips during and after the cutting.

EXPLANATIONS OF NUMERALS OR LETTERS

3 . . . front face (laser light entrance surface); 5 . . . line to cut; 7 . . . modified region; 11 . . . silicon wafer; 13 . . . molten processed region; 53 . . . condenser lens; 57 . . . spherical aberration correction member; L . . . laser light

BEST MODES FOR CARRYING OUT THE INVENTION

In the following, a preferred embodiment of the present invention will be explained in detail with reference to the drawings. In the laser processing method in accordance with the embodiment, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/ (beam spot cross-sectional area of laser light×pulse width). In the case of continuous waves, the intensity of laser light is determined by the field intensity (W/cm$^2$) of laser light at the converging point.

Figure 1:
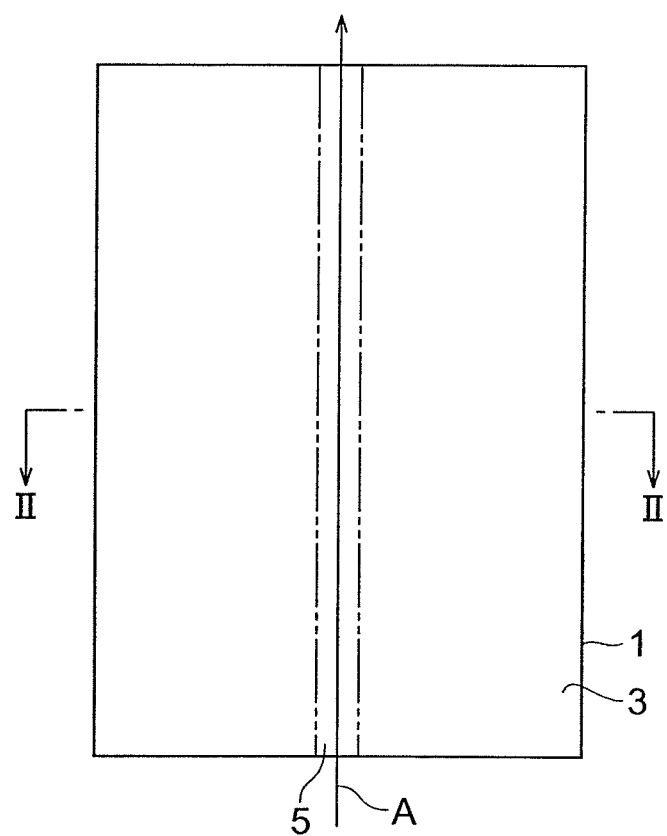
FIG. 1 is a plan view of an object to be processed during laser processing by the laser processing method in accordance with an embodiment.
Figure 2:
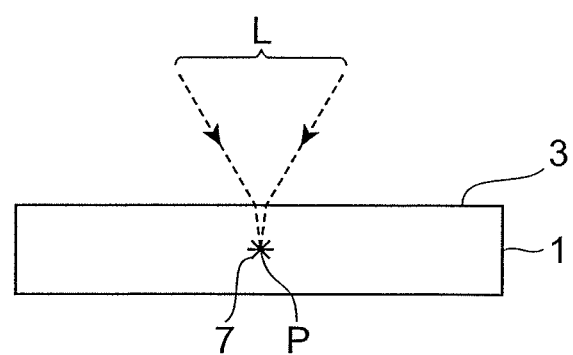
FIG. 2 is a sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a wafer-shaped (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
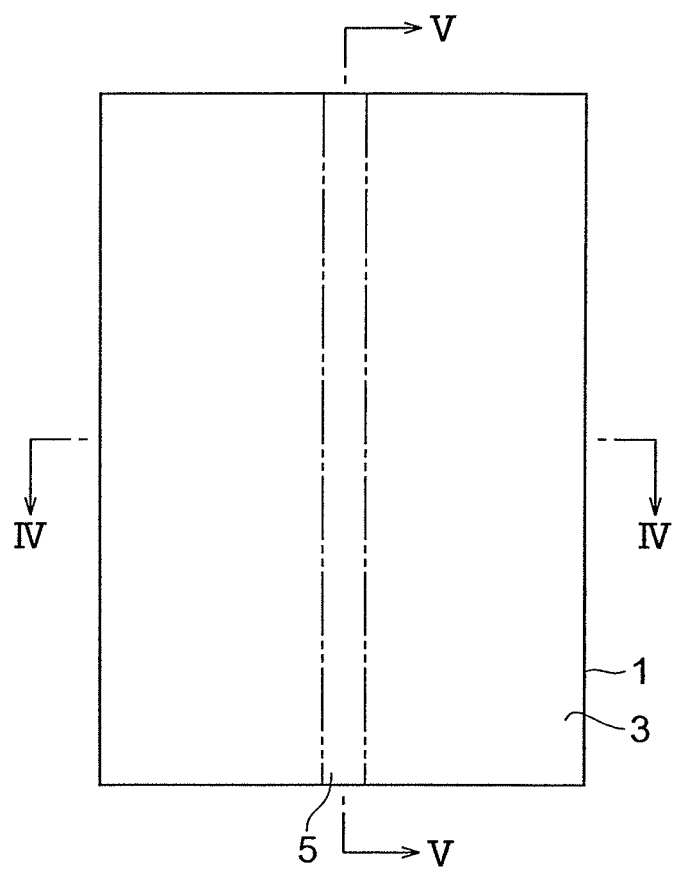
FIG. 3 is a plan view of the object after the laser processing by the laser processing method in accordance with the embodiment.
Figure 4:
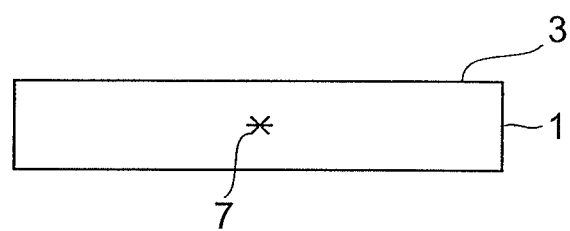
FIG. 4 is a sectional view of the object taken along the line IV-IV of FIG. 3.
Figure 5:
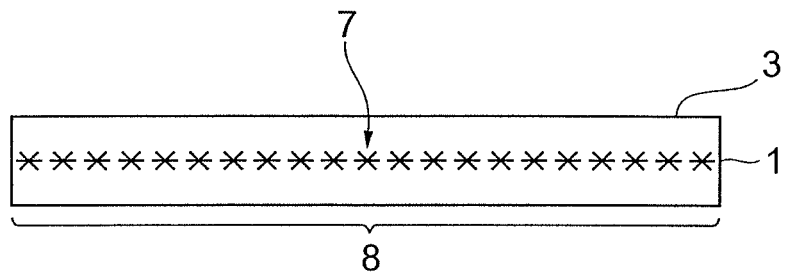
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the modified region 7 is not formed by the heat generated from the object 1 absorbing the laser light L. The laser light L is transmitted through the object 1, so as to generate multiphoton absorption therewithin, thereby forming the modified region 7. Therefore, the front face 3 of the object 1 hardly absorbs the laser light L and does not melt.

Figure 6:
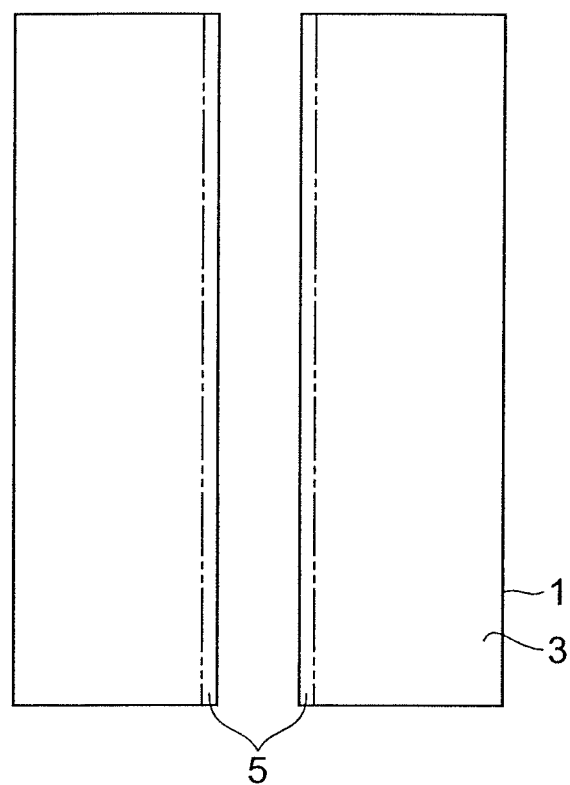
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress on the object 1 along the starting point region for cutting 8, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 such as silicon wafer has recently been apt to decrease its thickness.

An example of the modified region formed by multiphoton absorption in the laser processing method in accordance with the embodiment is a molten processed region.

An object to be processed (e.g., semiconductor material such as silicon) is irradiated with laser light while locating a converging point within the object under a condition with a field intensity of at least 1×10$^8$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ (W/cm$^2$), for example. The pulse width is preferably 1 ns to 200 ns, for example.

By an experiment, the inventors verified that a molten processed region was formed within a silicon wafer. The following are conditions of the experiment.

(A) Object to be processed: silicon wafer (with a thickness of 350 μm and an outer diameter of 4 inches)

(B) Laser light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns
output: 20 μJ/pulse
laser light quality: TEM$_{00}$
polarizing property: linear polarization (C) Condenser lens magnification: ×50
N.A.: 0.55
transmittance at a laser light wavelength: 60%

(D) Moving rate of the mount table mounting the object: 100 mm/sec

Figure 7:
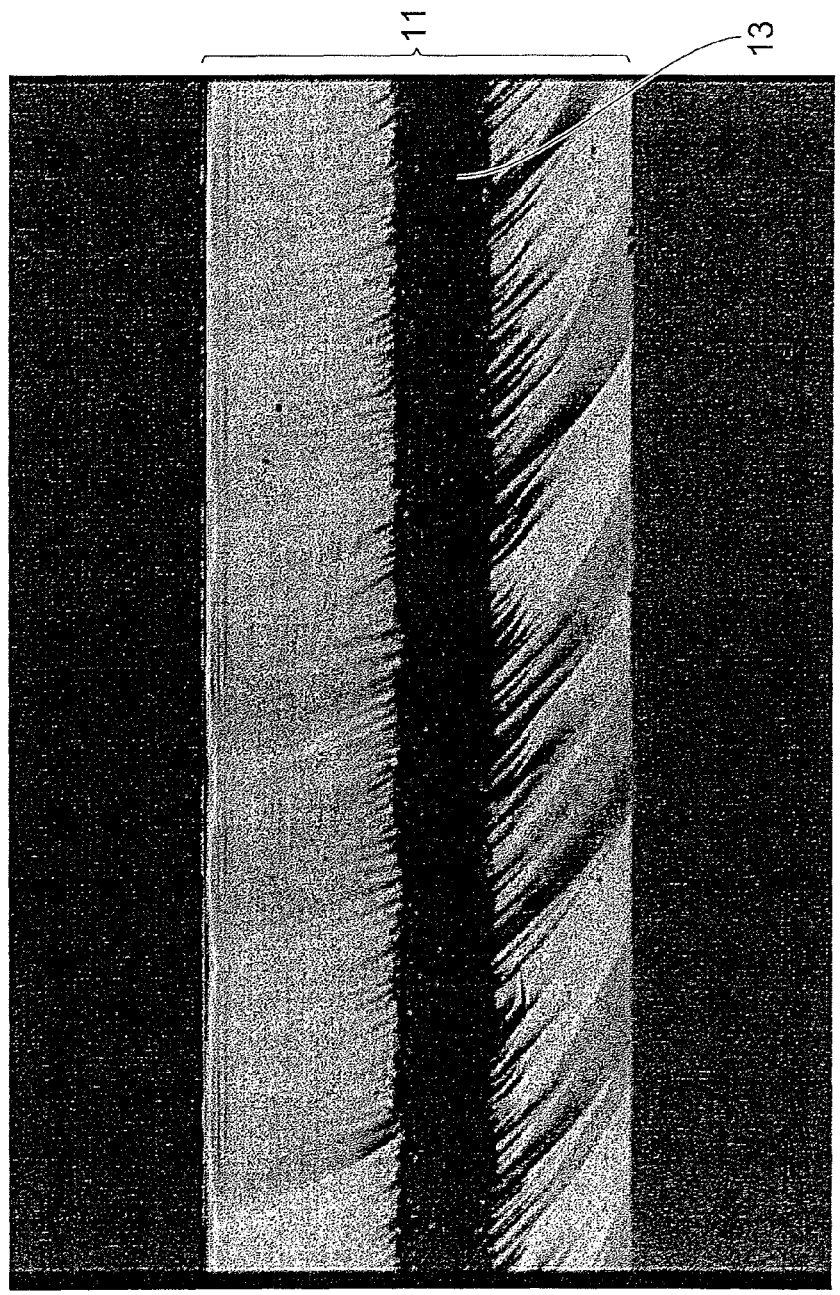
FIG. 7 is a view showing a photograph of a cut section in a part of a silicon wafer cut by the laser processing method in accordance with the embodiment.

FIG. 7 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 8:
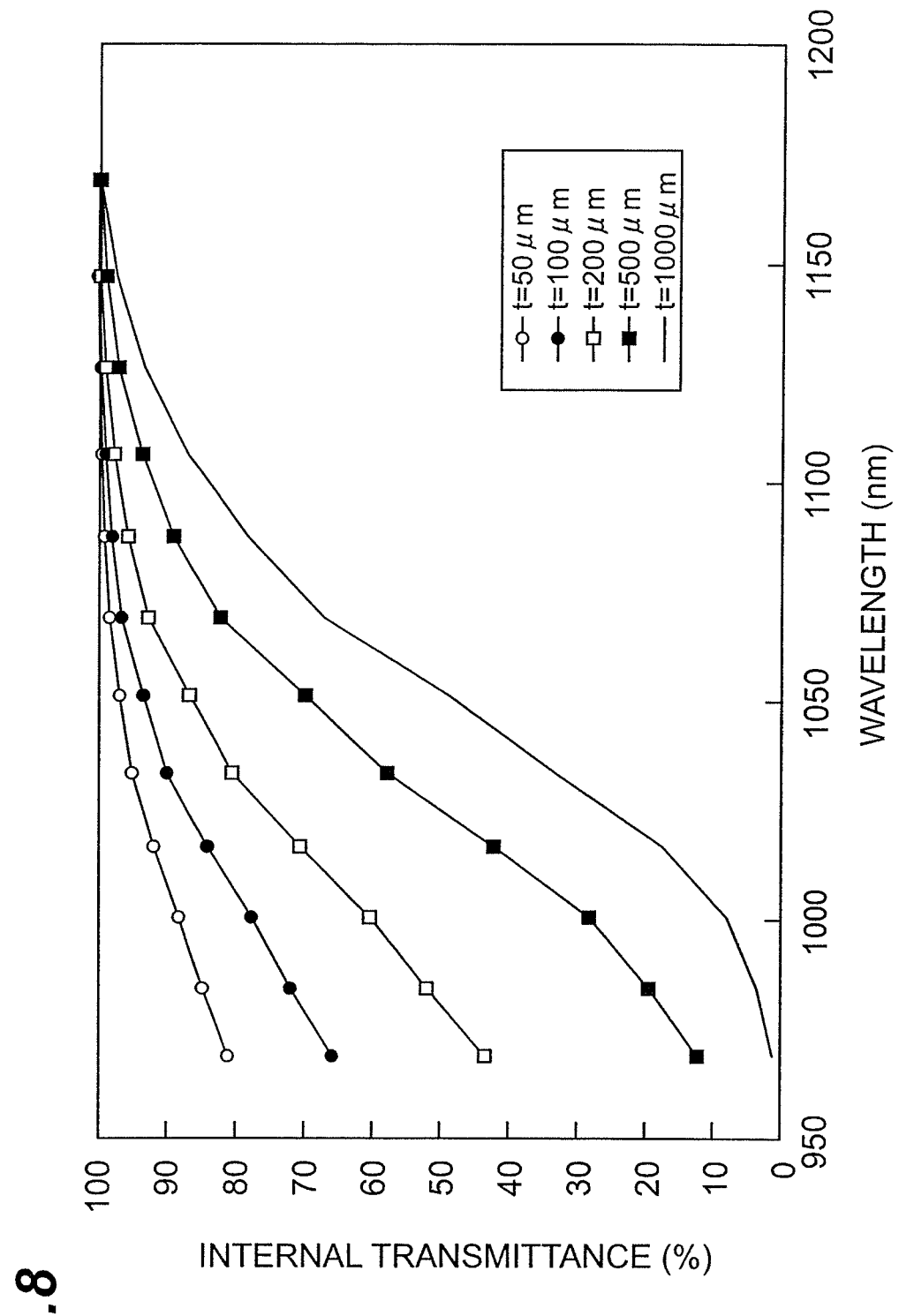
FIG. 8 is a graph showing relationships between the laser light wavelength and the transmittance within a silicon substrate in the laser processing method in accordance with the embodiment.

The fact that the molten processed region 13 is formed by multiphoton absorption will now be explained. FIG. 8 is a graph showing relationships between the laser light wavelength and the transmittance within the silicon substrate. Here, the respective reflected components on the front and rear face sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 7 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 7. When a starting point region for cutting is thus formed within the object by a molten processed region, unnecessary fractures deviating from a starting point region for cutting line are harder to occur at the time of cleaving, whereby cleavage control becomes easier.

While the molten processed region is explained in the foregoing as a modified region formed by multiphoton absorption, a starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the direction to be formed therewith, the starting point region for cutting extending in the direction to be formed with the starting point region for cutting can be formed easily and accurately in the substrate with reference to the orientation flat.

Figure 9:
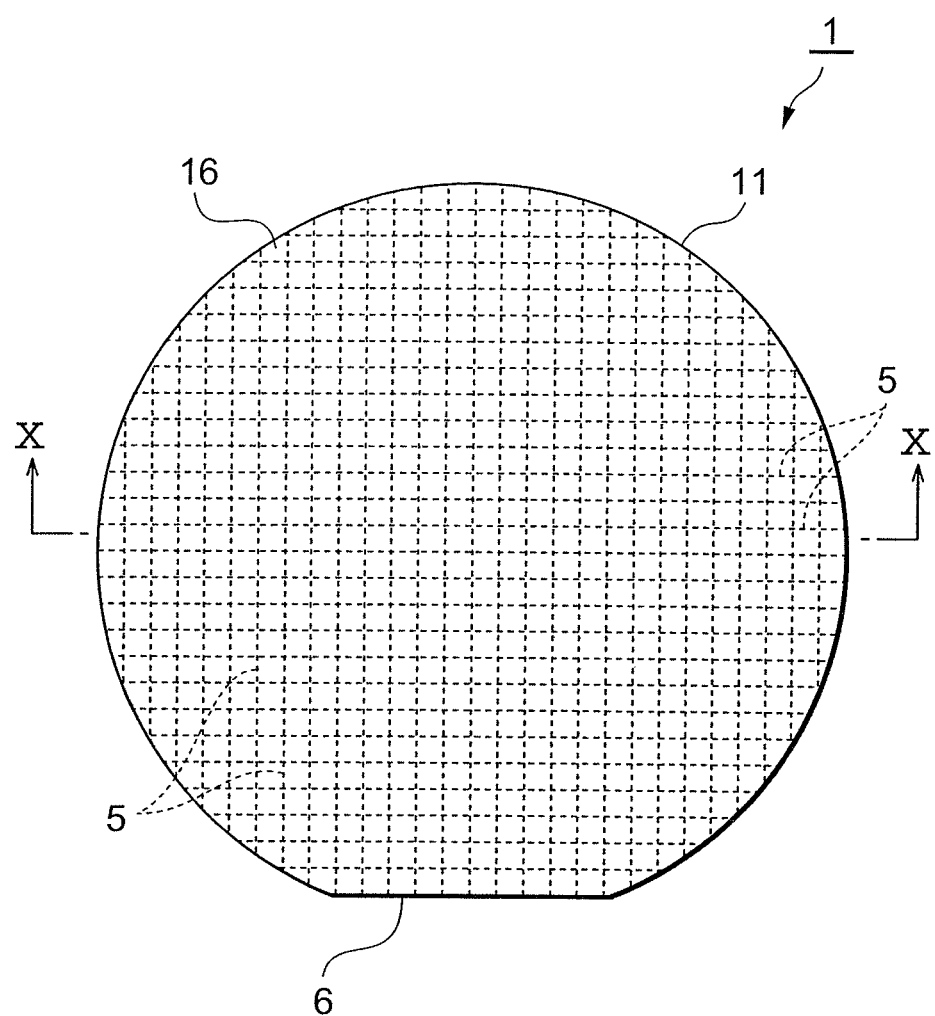
FIG. 9 is a plan view of the object in the laser processing method in accordance with the embodiment.

The preferred embodiment of the present invention will now be explained. FIG. 9 is a plan view of the object to be processed in the laser processing method in accordance with the embodiment, whereas FIG. 10 is a sectional view of a part of the object taken along the line X-X of FIG. 9.

Figure 10:
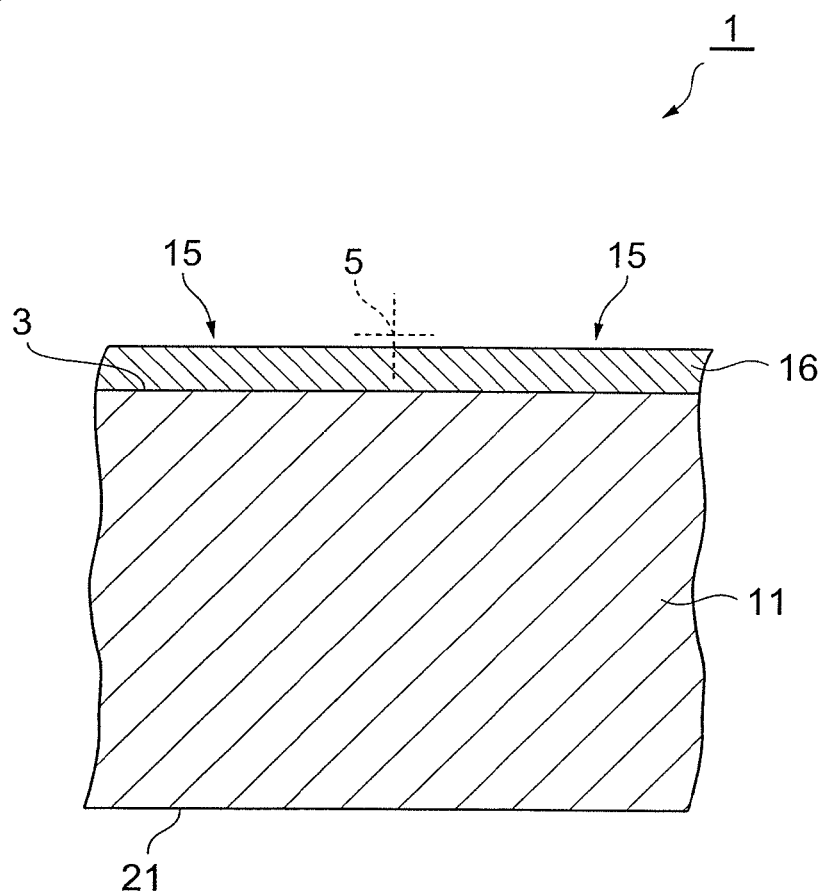
FIG. 10 is a sectional view of a part of the object taken along the line X-X of FIG. 9.

As shown in FIGS. 9 and 10, the object 1 comprises a silicon wafer 11 having a thickness of 625 μm and a functional device layer 16, formed on the front face 3 of the silicon wafer 11, including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11.

Figure 11:
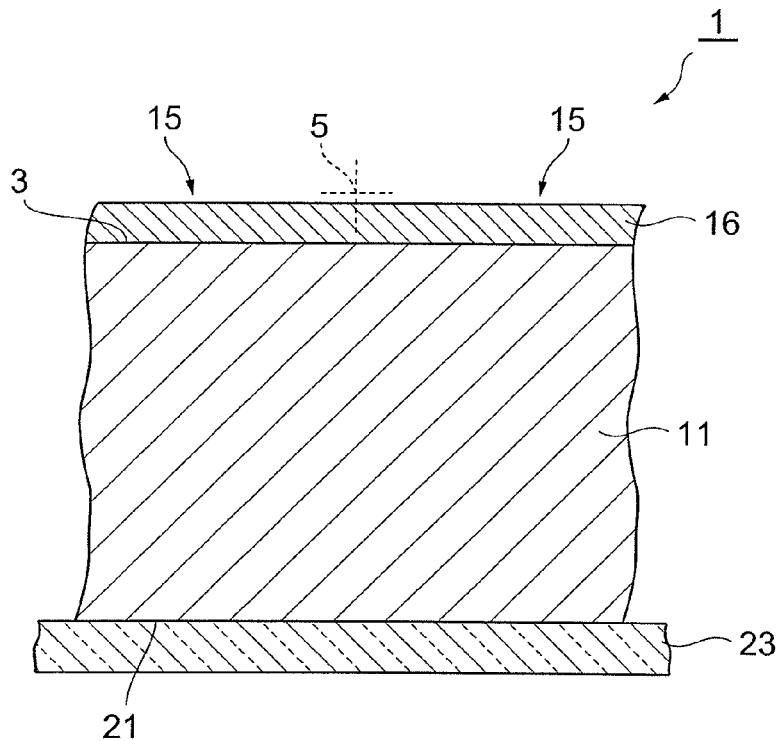
FIG. 11 is a view for explaining the laser processing method in accordance with the embodiment, in which (a) is a state where an expandable tape is attached to the object, and (b) is a state where the object is irradiated with laser light.
Figure 11:
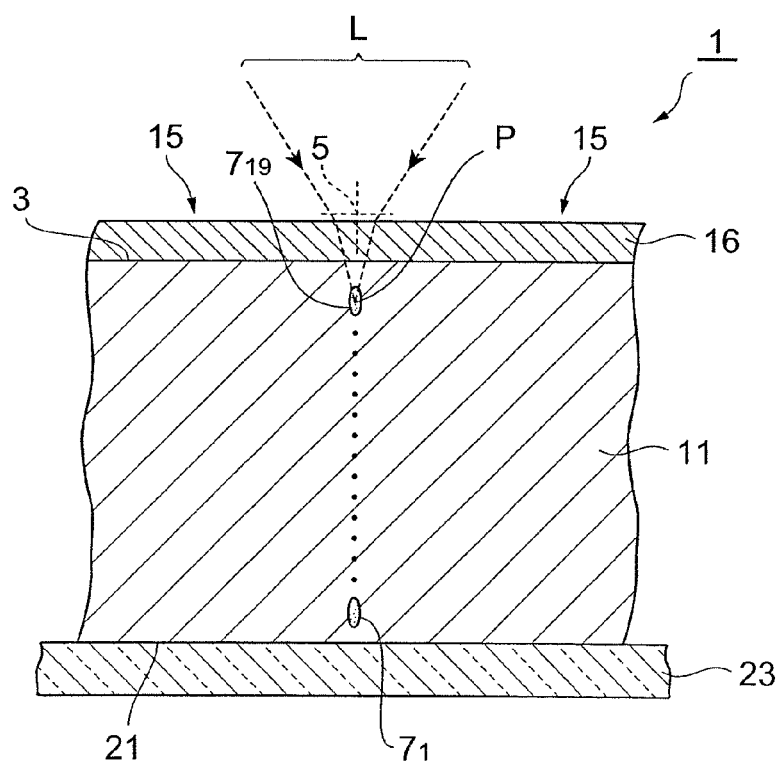

Thus constructed object 1 is cut into the functional devices 15 as follows. First, an expandable tape 23 is attached to the rear face 21 of the silicon wafer 11 as shown in FIG. 11(a). Subsequently, as shown in FIG. 11(b), the object 1 is secured onto a mount table of a laser processing apparatus (not shown) with the functional device layer 16 facing up.

Then, the object 1 is irradiated with laser light L, while using the front face 3 as a laser light entrance surface and locating a converging point P within the silicon wafer 11 under a condition causing multiphoton absorption, and the mount table is moved such as to scan the converging point P along lines to cut 5 (see broken lines in FIG. 9) which are set like grids passing between the functional devices 15, 15 adjacent to each other.

The scanning of the converging point P along the lines to cut 5 is performed 19 times for each line to cut 5 with respective distances from the front face 3 to the position at which the converging point P is focused, whereby 19 rows of modified regions $7_1$ to $7_{19}$ are successively formed one by one from the rear face 21 side within the silicon wafer 11 along the line to cut 5 under the conditions shown in the following Table 2. Each of the modified regions $7_1$ to $7_{19}$ is a molten processed region which may include cracks mixed therein.

TABLE 2

| | Converging point position (μm) | Exit output (W) | Divergent angle (°) |
|---|---|---|---|
| Modified region $7_1$ | 618 | 1.2 | 0.2 |
| Modified region $7_2$ | 603 | 1.2 | 0.2 |
| Modified region $7_3$ | 588 | 1.2 | 0.2 |
| Modified region $7_4$ | 573 | 1.2 | 0.2 |
| Modified region $7_5$ | 558 | 1.2 | 0.2 |
| Modified region $7_6$ | 545 | 1.2 | 0.2 |
| Modified region $7_7$ | 520 | 0.92 | 0.4 |
| Modified region $7_8$ | 496 | 0.92 | 0.4 |
| Modified region $7_9$ | 469 | 0.92 | 0.4 |
| Modified region $7_{10}$ | 434 | 0.92 | 0.4 |
| Modified region $7_{11}$ | 404 | 0.92 | 0.4 |
| Modified region $7_{12}$ | 368 | 0.92 | 0.4 |
| Modified region $7_{13}$ | 330 | 1.2 | 0.2 |
| Modified region $7_{14}$ | 299 | 1.2 | 0.2 |
| Modified region $7_{15}$ | 261 | 1.2 | 0.2 |
| Modified region $7_{16}$ | 220 | 1.2 | 0.2 |
| Modified region $7_{17}$ | 175 | 1.2 | 0.2 |
| Modified region $7_{18}$ | 120 | 1.2 | 0.2 |
| Modified region $7_{19}$ | 73 | 0.72 | 0.2 |

Figure 12:
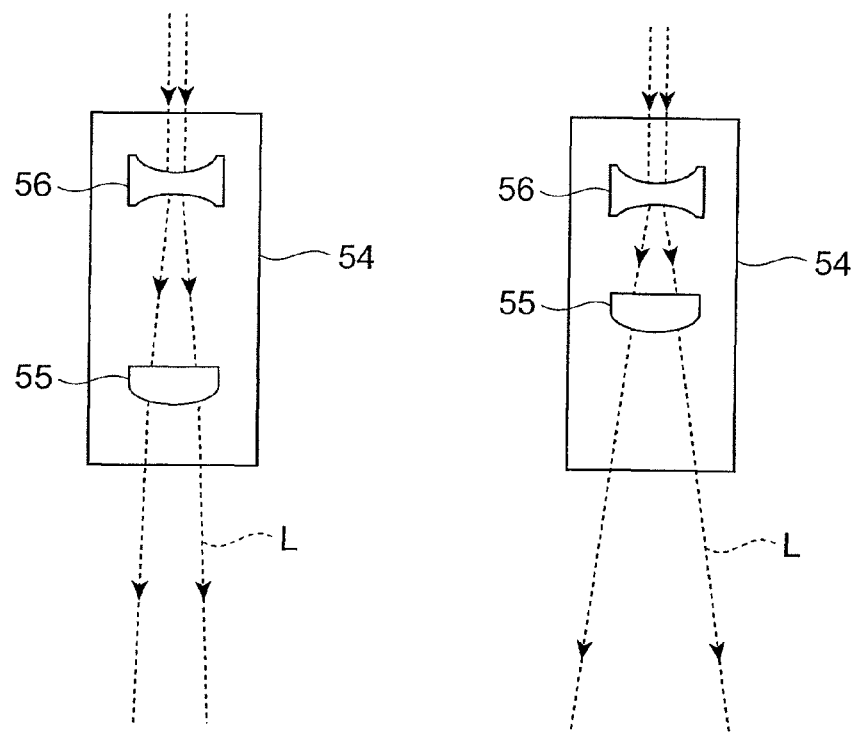
FIG. 12 is a diagram showing a beam expander for changing the divergent angle of laser light incident on a condenser lens.

As can be seen from the above-mentioned Table 2, the divergent angle of the laser light L incident on the condenser lens of the laser processing apparatus is set to 0.4° when forming the modified regions $7_7$ to $7_{12}$ positioned in areas where the depth from the front face 3 of the silicon wafer 11 is 335 μm to 525 μm. On the other hand, the divergent angle of the laser light L incident on the condenser lens of the laser processing apparatus is set to 0.2° when forming the modified regions $7_1$ to $7_6$ positioned in areas where the depth from the front face 3 of the silicon wafer 11 exceeds 525 μm and when forming the modified regions $7_{13}$ to $7_{19}$ positioned in areas where the depth is less than 335 μm. For increasing the divergent angle of the laser light L incident on the condenser lens, it will be sufficient if a convex lens 55 is brought closer to a concave lens 56 in a beam expander 54 as shown in FIGS. 12(a) and (b).

Figure 13:
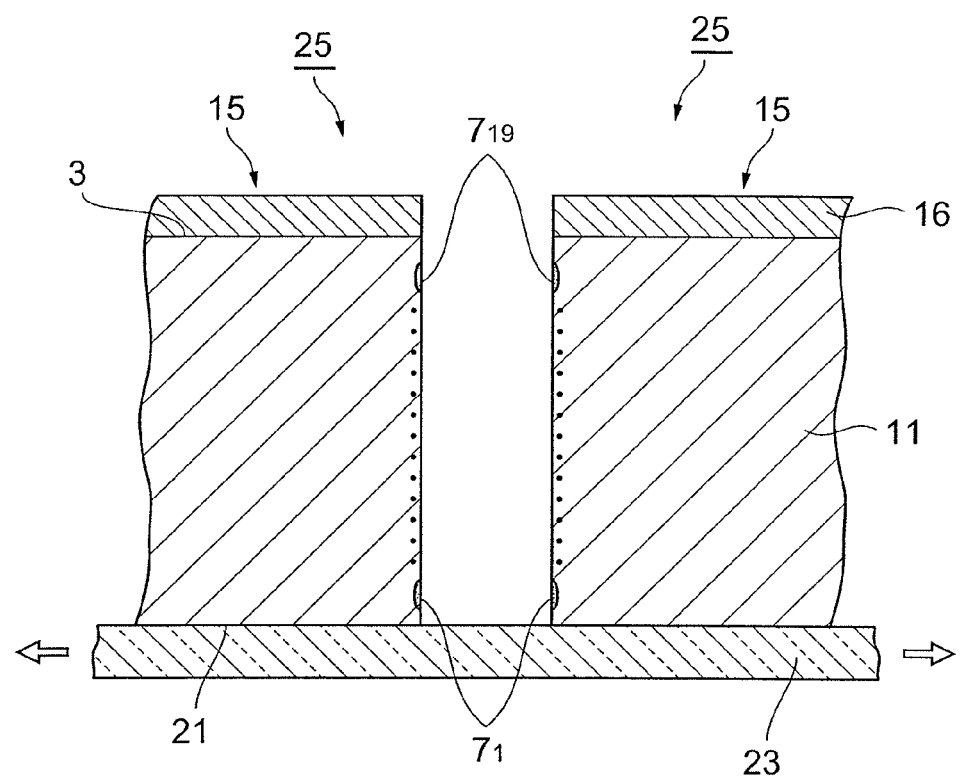
FIG. 13 is a view for explaining the laser processing method in accordance with the embodiment, illustrating a state where the expandable tape is expanded.

After forming the modified regions $7_{13}$ to $7_{19}$, the expandable tape 23 is expanded as shown in FIG. 13, so as to generate a fracture from each of the modified regions $7_{13}$ to $7_{19}$ acting as a start point, thereby cutting the silicon wafer 11 and functional device layer 16 along the lines to cut 5 and separating semiconductor chips 25 obtained by the cutting from each other.

In the above-mentioned laser processing method, as explained in the foregoing, the divergent angle (0.4°) of the laser light L incident on the condenser lens when forming the modified regions $7_7$ to $7_{12}$ is made greater than the divergent angle (0.2°) of the laser light L incident on the condenser lens when forming the modified regions $7_{13}$ to $7_{19}$. This makes the irradiation condition of laser light L for forming the modified regions $7_7$ to $7_{12}$ different from the irradiation condition of laser light L for forming the modified regions $7_{13}$ to $7_{19}$ such as to correct the spherical aberration of laser light L in the areas where the depth from the front face 3 of the silicon wafer 11 is 335 μm to 525 μm. Therefore, even when the silicon wafer 11 and functional device layer 16 are cut into the semiconductor chips 25 from the modified regions $7_1$ to $7_{19}$ acting as a cutting start point, twist hackles do not appear remarkably in the areas where the depth is 335 μm to 525 μm, whereby particles are hard to occur. Hence, the above-mentioned laser processing method can prevent particles from occurring from cut sections of the semiconductor chips 25.

Figure 14:
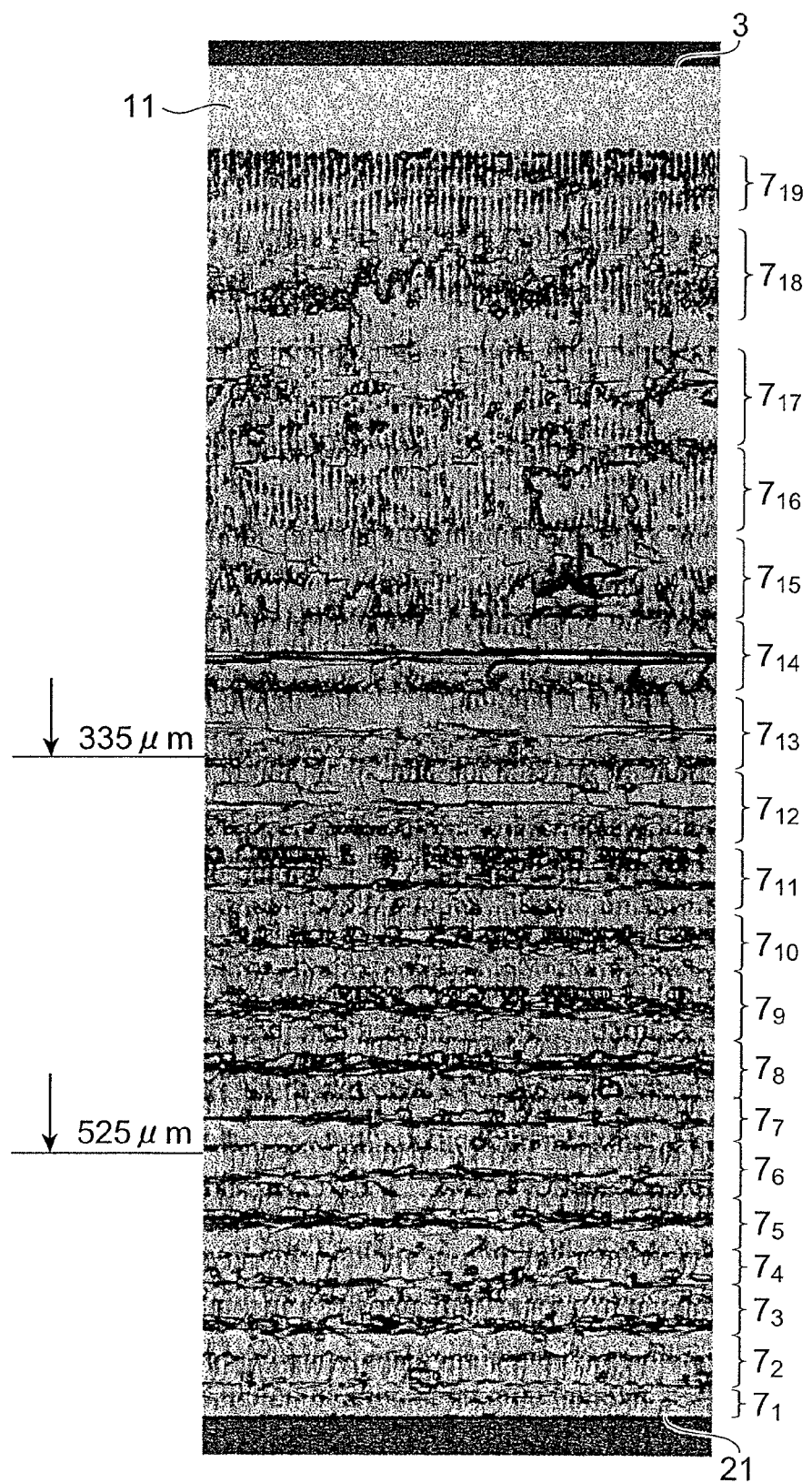
FIG. 14 is a view showing a photograph obtained when forming 19 rows of modified regions for a line to cut within a silicon wafer having a thickness of 625 µm by the laser processing method in accordance with the embodiment.
Figure 15:
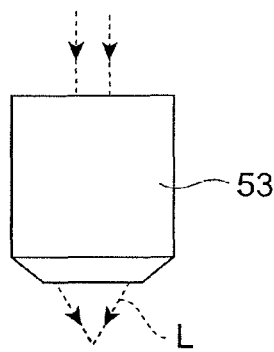
FIG. 15 is a diagram showing a condenser lens for changing the exit NA.
Figure 15:
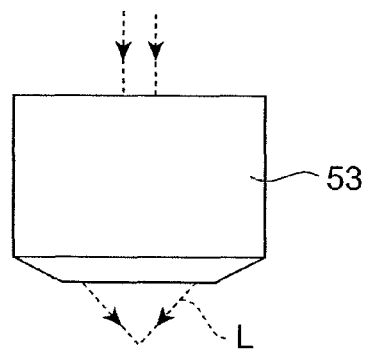
Figure 16:
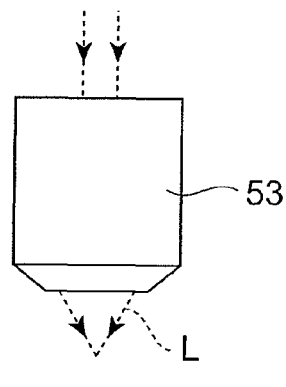
FIG. 16 is a diagram showing a condenser lens and spherical aberration correction member for changing a spherical aberration.
Figure 16:
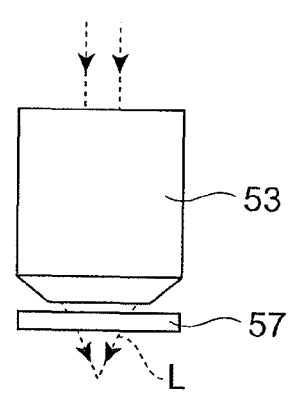

FIG. 14 is a view showing a photograph obtained when forming 19 rows of modified regions for a line to cut within a silicon wafer having a thickness of 625 μm by the laser processing method in accordance with the embodiment. In this example, as shown in the drawing, twist hackles do not appear remarkably in the areas where the depth from the front face 3 of the silicon wafer 11 is 335 μm to 525 μm in addition to the areas where the depth is more than 525 μm and less than 335 μm. Therefore, the cut sections of the silicon wafer 11 seem to be in a state where particles are hard to occur.

Meanwhile, when the divergent angle of the laser light L incident on the condenser lens of the laser processing apparatus is set to 0.4° in the areas where the depth from the front face 3 of the silicon wafer 11 exceeds 525 μm as in the areas where the depth is 335 μm to 525 μm, a problem of the modified regions $7_1$ to $7_6$ failing to connect together occurs because of energy shortage in the laser light L. For solving this problem, the energy of laser light L may be enhanced without setting the divergent angle of the laser light L incident on the condenser lens to 0.2°.

When the divergent angle of the laser light L incident on the condenser lens of the laser processing apparatus is set to 0.4° in the areas where the depth from the front face 3 of the silicon wafer 11 is less than 335 μm as in the areas where the depth is 335 μm to 525 μm, a problem of increasing twist hackles and the like occur. Setting the divergent angle of the laser light L incident on the condenser lens to 0.2° is effective in solving this problem.

The present invention is not limited to the above-mentioned embodiment.

For example, the divergent angle of the laser light L incident on the condenser lens when forming the modified regions $7_7$ to $7_{12}$ may be made not only greater than that of the laser light L incident on the condenser lens when forming the modified regions $7_{13}$ to $7_{19}$ but also as follows, so as to make the irradiation condition of laser light L for forming the modified regions $7_7$ to $7_{12}$ different from the irradiation condition of laser light L for forming the modified regions $7_{13}$ to $7_{19}$ such as to correct the spherical aberration of laser light L.

Namely, the exit NA (numerical aperture) of the condenser lens 53 for forming the modified regions $7_7$ to $7_{12}$ (see FIG. 12(b)) may be made greater than the exit NA (numerical aperture) of the condenser lens 53 for forming the modified regions $7_{13}$ to $7_{19}$ (see FIG. 12(a)).

A spherical aberration correction member 57 may be arranged between the condenser lens 53 and the silicon wafer when forming the modified regions $7_7$ to $7_{12}$ (see FIG. 13(b)) but not when forming the modified regions $7_{13}$ to $7_{19}$ (see FIG. 13(a)). The spherical aberration correction member 57 is a member such as a silica glass sheet having a thickness of 0.5 mm, for example, which generates a spherical aberration in a direction canceling a spherical aberration corresponding to a depth from the laser light entrance surface of the silicon wafer.

Also, a condenser lens originally left with such a spherical aberration as to cancel a spherical aberration corresponding to a depth from the laser light entrance surface of the silicon wafer may be prepared, and such condenser lenses may be switched according to the depth from the laser light entrance surface of the silicon wafer. Further, a condenser lens which can change a lens performance such as to cancel a spherical aberration corresponding to a depth from the laser light entrance surface of the silicon wafer by moving a correction tube or the like within the condenser lens may be prepared, so as to change the lens performance of the condenser lens according to the depth from the laser light entrance surface of the silicon wafer.

Reducing the influence of spherical aberration instead of correcting the spherical aberration can also restrain twist hackles from appearing.

As the condenser lens is brought closer to the silicon wafer in order to converge the laser light into an area of the silicon wafer deeper from the laser light entrance surface, the converging position of center rays of the laser light and the converging position of marginal rays of the laser light deviate more from each other in the thickness direction of the wafer, so as to widen the energy distribution, whereby twist hackles appear when cutting a section. Therefore, making the energy of marginal rays lower than a processing threshold can reduce the influence of marginal rays, thereby restraining twist hackles from appearing.

Figure 17:
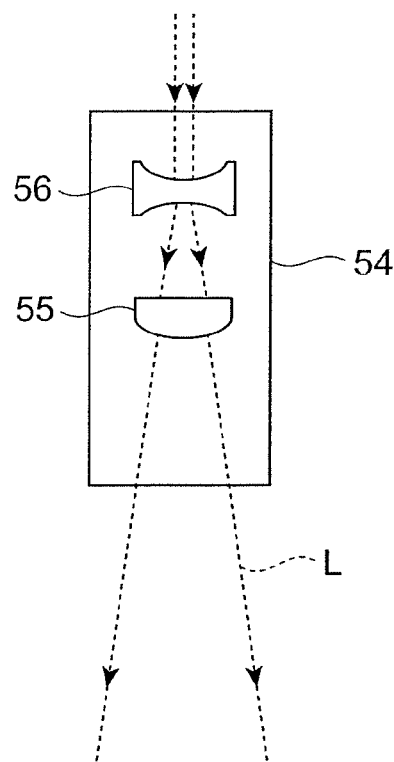
FIG. 17 is a diagram showing the beam expander for changing the divergent angle of laser light incident on the condenser lens and the relationship between the Gaussian distribution of laser light incident on the condenser lens and the entrance pupil diameter of the condenser lens.
Figure 17:
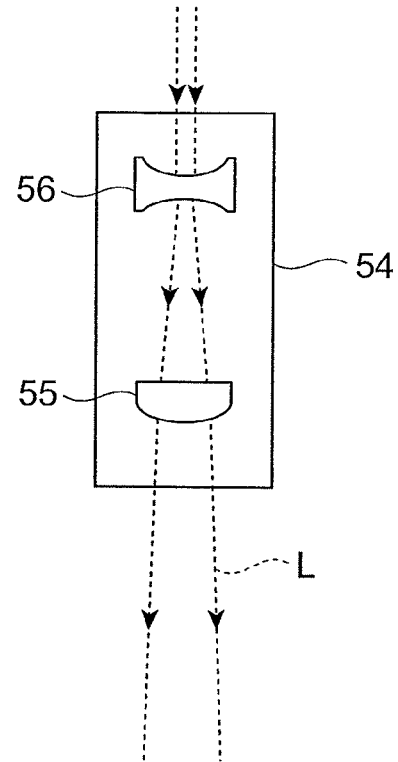
Figure 18:
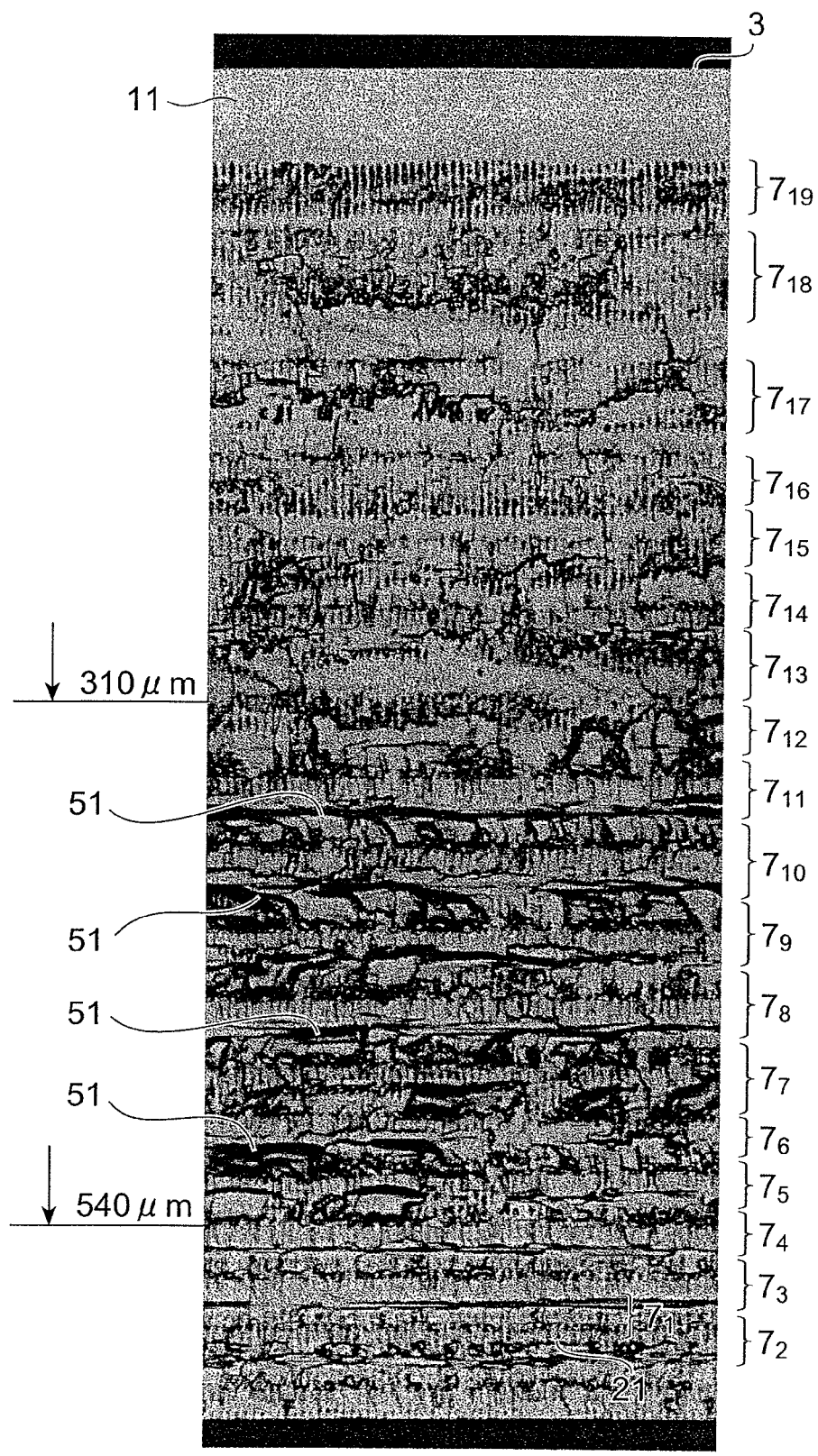
FIG. 18 is a view showing a photograph obtained when foaming 19 rows of modified regions for a line to cut within a silicon wafer having a thickness of 625 μm by the conventional laser processing method.
Figure 19:
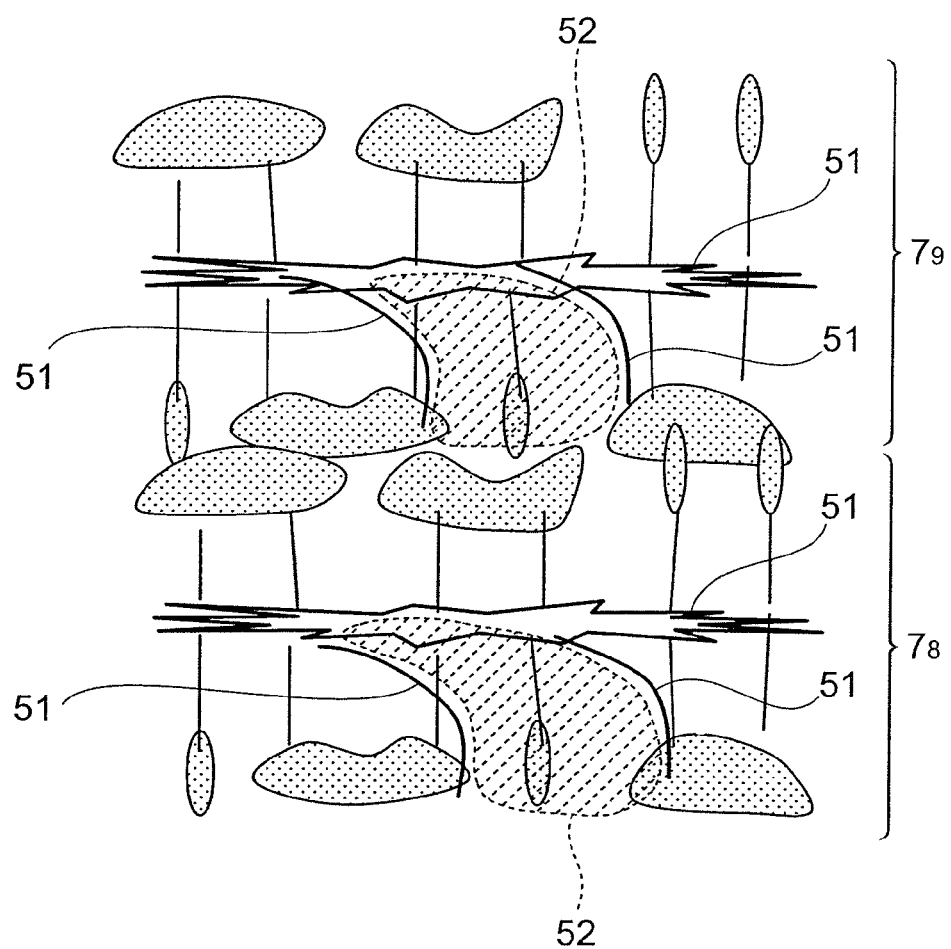
FIG. 19 is a schematic view of a cut section in an area of the silicon wafer where the depth from the front face is 310 μm to 540 μm.
Figure 20:
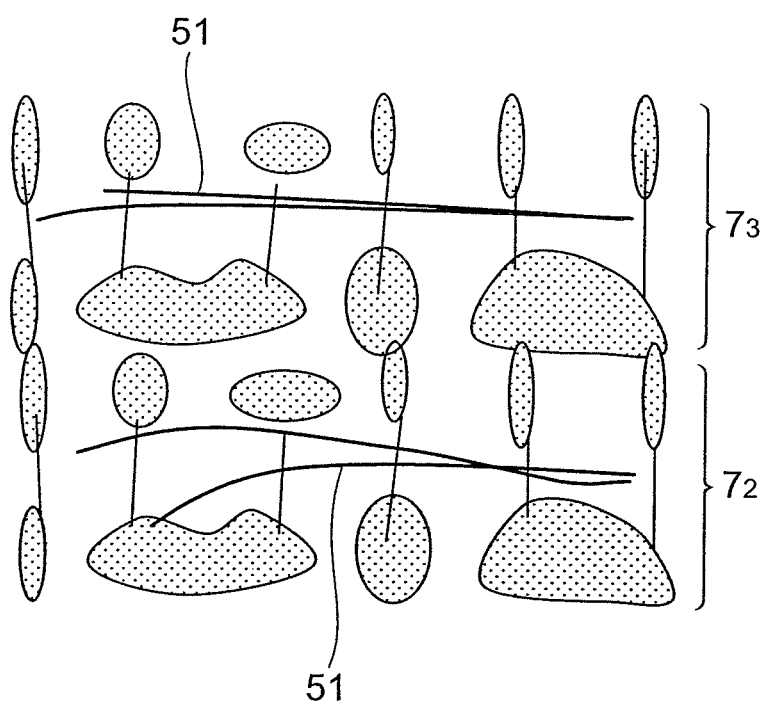
FIG. 20 is a schematic view of a cut section in an area of the silicon wafer where the depth from the front face exceeds 540 μm.
Figure 21:
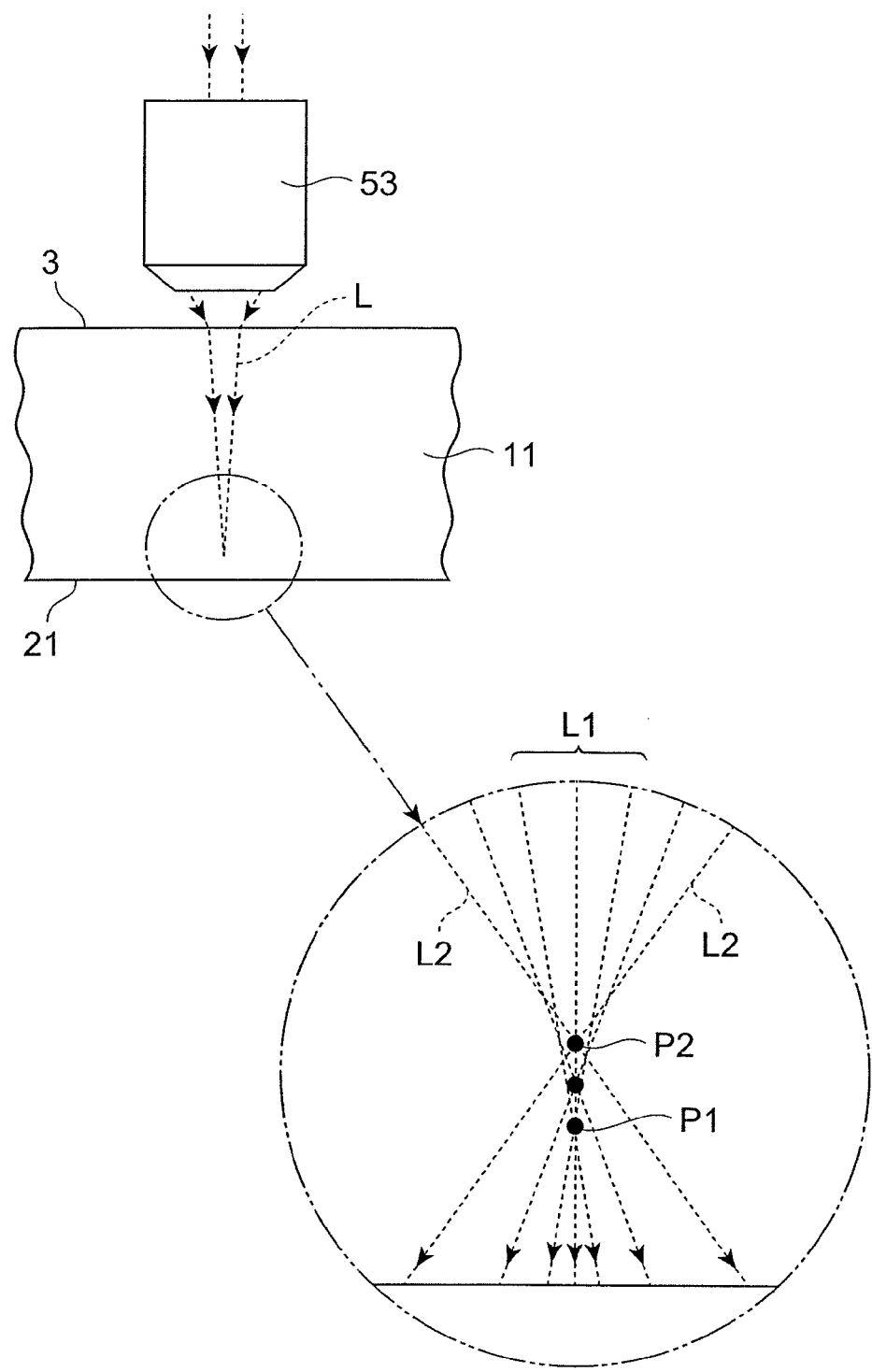
FIG. 21 is a schematic view showing a state of progress of laser light incident on the silicon wafer.

For example, when forming the modified regions $7_{13}$ to $7_{19}$, the divergent angle of laser light L is increased by the beam expander 54 as shown in FIG. 17(a), so that the energy of marginal rays incident on the entrance pupil (with a pupil diameter of d) is higher than the processing threshold. When forming the modified regions $7_7$ to $7_{12}$, on the other hand, the divergent angle of laser light L is reduced by the beam expander 54 as shown in FIG. 17(b), so that the energy of marginal rays incident on the entrance pupil (with the pupil diameter of d) is lower than the processing threshold.

While the above-mentioned embodiment is a case where a plurality of rows of modified regions are formed within a silicon wafer having a thickness t (500 µm<t) along a line to cut, the following can prevent particles from occurring from cut sections of chips obtained by cutting a silicon wafer having a thickness t (350 µm<t≤500 µm) when forming a plurality of rows of modified regions within this silicon wafer along a line to cut. Namely, it will be sufficient if the laser light irradiation condition for forming a modified region in an area where the depth from the laser light entrance surface of the silicon wafer is 350 µm to t µm is made different from the laser light irradiation condition for forming a modified region in an area where the depth is 0 µm to 250 µm such as to correct the spherical aberration of laser light in the area where the depth is 350 µm to t µm.

Though the above-mentioned embodiment is a case where the front face of the silicon wafer is used as the laser light entrance surface, the rear face of the silicon wafer may be employed as the laser light entrance surface. Though the above-mentioned embodiment is a case where the functional layer exists on lines to cut, the front face of the silicon wafer may be used as the laser light entrance surface in a state where the front face of the silicon wafer is exposed with no functional device layer on the lines to cut.

The number of rows of modified regions formed within the silicon wafer for a line to cut varies depending on the thickness of the silicon wafer and the like without being restricted to 19.

Industrial Applicability

Even when a silicon wafer is cut into chips, the present invention can prevent particles from occurring from cut sections of the chips during and after the cutting.

The invention claimed is:

1. A laser processing method of converging laser light within a silicon wafer having a thickness t (500 µm <t) with a condenser lens so as to form a plurality of rows of modified regions to become a cutting start point within the silicon wafer along a cutting line for cutting the silicon wafer, the method comprising the steps of:
    forming a first modified region along the cutting line in a first area having a depth of 350 µm to 500 µm from a laser light entrance surface of the silicon wafer by locating a converging point of the laser light in the first area; and
    forming a second modified region along the cutting line in a second area having a depth of 0 µm to 250 µm from the laser light entrance surface by locating the converging point in the second area;
    wherein, when forming the first modified region, the laser light is converged within the silicon wafer so as to cancel a spherical aberration to occur in response to a depth from the laser light entrance surface, and in the laser light emitted from the condenser lens, the converging position of center rays and converging position of marginal rays are restrained from deviating from each other in the thickness direction of the silicon wafer, and thereby an the influence of the spherical aberration is reduced.

2. A laser processing method of converging laser light within a silicon wafer having a thickness t (350 µm <t≤500 µm) with a condenser lens so as to form a plurality of rows of modified regions to become a cutting start point within the silicon wafer along a cutting line for cutting the silicon wafer, the method comprising the steps of:
    forming a first modified region along the cutting line in a first area having a depth of 350 µm to t µm from a laser light entrance surface of the silicon wafer by locating a converging point of the laser light in the first area; and
    forming a second modified region along the cutting line in a second area having a depth of 0 µm to 250 µm from the laser light entrance surface by locating the converging point in the second area;
    wherein, when forming the first modified region, the laser light is converged within the silicon wafer so as to cancel a spherical aberration to occur in response to a depth from the laser light entrance surface, and in the laser light emitted from the condenser lens, the converging position of center rays and converging position of marginal rays are restrained from deviating from each other in the thickness direction of the silicon wafer, and thereby an influence of the spherical aberration is reduced.

3. A laser processing method of converging laser light within a silicon wafer having a thickness t (500 μm <t) with a condenser lens so as to form a plurality of rows of modified regions to become a cutting start point within the silicon wafer along a cutting line for cutting the silicon wafer, the method comprising the steps of:
   forming a first modified region along the cutting line in a first area having a depth of 350 μm to 500 μm from a laser light entrance surface of the silicon wafer by locating a converging point of the laser light in the first area; and
   forming a second modified region along the cutting line in a second area having a depth of 0 μm to 250 μm from the laser light entrance surface by locating the converging point in the second area;
   wherein, when forming the first modified region, the laser light is converged within the silicon wafer so as to cancel a spherical aberration to occur in response to a depth from the laser light entrance surface, and thereby an influence of the spherical aberration is reduced; and
   wherein, when forming the first modified region, a member which acts to cancel the spherical aberration to occur in response to the depth from the laser light entrance surface is arranged between the condenser lens and the silicon wafer, and thereby, in the laser light emitted from the condenser lens, the converging position of center rays and converging position of marginal rays are restrained from deviating from each other in the thickness direction of the silicon wafer, and the influence of the spherical aberration is reduced.

4. A laser processing method according to claim 3, wherein the first and second modified regions are molten processed regions.

5. A laser processing method of converging laser light within a silicon wafer having a thickness t (500 μm <t) with a condenser lens so as to form a plurality of rows of modified regions to become a cutting start point within the silicon wafer along a cutting line for cutting the silicon wafer, the method comprising the steps of:
   forming a first modified region along the cutting line in a first area having a depth of 350 μm to 500 μm from a laser light entrance surface of the silicon wafer by locating a converging point of the laser light in the first area; and
   forming a second modified region along the cutting line in a second area having a depth of 0 μm to 250 μm from the laser light entrance surface by locating the converging point in the second area;
   wherein, when forming the first modified region, the laser light is converged within the silicon wafer so as to cancel a spherical aberration to occur in response to a depth from the laser light entrance surface, and thereby an influence of the spherical aberration is reduced; and
   wherein, when forming the first modified region, the condenser lens which can change a lens performance so as to cancel the spherical aberration to occur in response to the depth from the laser light entrance surface is used, and thereby, in the laser light emitted from the condenser lens, the converging position of center rays and converging position of marginal rays are restrained from deviating from each other in the thickness direction of the silicon wafer, and the influence of the spherical aberration is reduced.

6. A laser processing method according to claim 5, wherein the first and second modified regions are molten processed regions.

7. A laser processing method of converging laser light within a silicon wafer having a thickness t (350 μm <t≤500 μm) with a condenser lens so as to form a plurality of rows of modified regions to become a cutting start point within the silicon wafer along a cutting line for cutting the silicon wafer, the method comprising the steps of:
   forming a first modified region along the cutting line in a first area having a depth of 350 μm to t μm from a laser light entrance surface of the silicon wafer by locating a converging point of the laser light in the first area; and
   forming a second modified region along the cutting line in a second area having a depth of 0 μm to 250 μm from the laser light entrance surface by locating the converging point in the second area;
   wherein, when forming the first modified region, the laser light is converged within the silicon wafer so as to cancel a spherical aberration to occur in response to a depth from the laser light entrance surface, and thereby an influence of the spherical aberration is reduced; and
   wherein, when forming the first modified region, a member which acts to cancel the spherical aberration to occur in response to the depth from the laser light entrance surface is arranged between the condenser lens and the silicon wafer, and thereby, in the laser light emitted from the condenser lens, the converging position of center rays and converging position of marginal rays are restrained from deviating from each other in the thickness direction of the silicon wafer, and the influence of the spherical aberration is reduced.

8. A laser processing method according to claim 7, wherein the first and second modified regions are molten processed regions.

9. A laser processing method of converging laser light within a silicon wafer having a thickness t (350 μm <t≤500 μm) with a condenser lens so as to form a plurality of rows of modified regions to become a cutting start point within the silicon wafer along a cutting line for cutting the silicon wafer, the method comprising the steps of:
   forming a first modified region along the cutting line in a first area having a depth of 350 μm to t μm from a laser light entrance surface of the silicon wafer by locating a converging point of the laser light in the first area; and
   forming a second modified region along the cutting line in a second area having a depth of 0 μm to 250 μm from the laser light entrance surface by locating the converging point in the second area;
   wherein, when forming the first modified region, the laser light is converged within the silicon wafer so as to cancel a spherical aberration to occur in response to a depth from the laser light entrance surface, and thereby an influence of the spherical aberration is reduced; and
   wherein, when forming the first modified region, the condenser lens which can change a lens performance so as to cancel the spherical aberration to occur in response to the depth from the laser light entrance surface is used, and thereby, in the laser light emitted from the condenser lens, the converging position of center rays and converging position of marginal rays are restrained from deviating from each other in the thickness direction of the silicon wafer, and the influence of the spherical aberration is reduced.

10. A laser processing method according to claim 9, wherein the first and second modified regions are molten processed regions.

* * * * *